(12) United States Patent
DiBene, II et al.

(10) Patent No.: US 6,356,448 B1
(45) Date of Patent: Mar. 12, 2002

(54) INTER-CIRCUIT ENCAPSULATED PACKAGING FOR POWER DELIVERY

(75) Inventors: Joseph Ted DiBene, II, Oceanside, CA (US); David Hartke, Durango, CO (US)

(73) Assignee: IncepTechnologies, Inc., San Diego, CA (US)

(*) Notice: Subject to any disclaimer, the term of this patent is extended or adjusted under 35 U.S.C. 154(b) by 0 days.

(21) Appl. No.: 09/432,878

(22) Filed: Nov. 2, 1999

(51) Int. Cl.⁷ .................................................. H05K 7/20
(52) U.S. Cl. .................. 361/721; 361/704; 361/707; 361/719; 361/720; 361/784; 361/785; 361/790; 174/252; 257/713
(58) Field of Search ................................ 361/688–690, 361/697, 704, 707–711, 715, 719–721, 784, 790; 174/16.1, 16.3, 52.2, 52.1; 165/80.2, 80.3, 185

(56) References Cited

U.S. PATENT DOCUMENTS

| | | | |
|---|---|---|---|
| 4,498,530 A | 2/1985 | Lipschutz | |
| 4,521,829 A | 6/1985 | Wessely | |
| 4,589,057 A | 5/1986 | Short | |
| 4,760,495 A | * 7/1988 | Till | 361/804 |
| 4,771,365 A | * 9/1988 | Cichocki et al. | 361/705 |
| 4,942,497 A | 7/1990 | Mine et al. | |
| 5,052,481 A | 10/1991 | Horvath et al. | |
| 5,161,089 A | 11/1992 | Chu et al. | |
| 5,195,020 A | 3/1993 | Suzuki et al. | |
| 5,272,599 A | 12/1993 | Koenen | |
| 5,331,510 A | 7/1994 | Ouchi et al. | |
| 5,343,358 A | 8/1994 | Hilbrink | |
| 5,365,402 A | 11/1994 | Hatada et al. | |
| 5,390,078 A | * 2/1995 | Taylor | 361/721 |
| 5,396,403 A | 3/1995 | Patel | |
| 5,409,055 A | 4/1995 | Tanaka et al. | |
| 5,467,251 A | 11/1995 | Katchmar | |
| 5,473,510 A | * 12/1995 | Dozier, II | 361/719 |
| 5,504,924 A | 4/1996 | Ohashi et al. | |
| 5,510,958 A | 4/1996 | Shimabara et al. | |
| 5,515,912 A | 5/1996 | Daikoku et al. | |
| 5,619,399 A | 4/1997 | Mok | |
| 5,621,615 A | 4/1997 | Dawson et al. | |
| 5,646,826 A | 7/1997 | Katchmar | |
| 5,661,902 A | 9/1997 | Katchmar | |
| 5,708,566 A | 1/1998 | Hunninghaus et al. | |

(List continued on next page.)

FOREIGN PATENT DOCUMENTS

| | | |
|---|---|---|
| EP | 0 582 145 | 2/1994 |
| EP | 0 717 443 A1 | 6/1996 |
| EP | 0 920 055 A2 | 6/1999 |
| JP | 11-074427 | 3/1999 |
| WO | WO 96/23397 | 8/1996 |

OTHER PUBLICATIONS

XP000124263, IBM Tech Disc Bulletin, "Multiple Electronic Board . . . System," 33(3B):55–56.
Patent Abstracts of Japan, 1997, vol. 4 & JP 08 330699, Dec. 13, 1996.
Int'l Search Report of PCT/US00/29452.

Primary Examiner—Leo P. Picard
Assistant Examiner—Boris L. Chervinsky
(74) Attorney, Agent, or Firm—Gates & Cooper LLP

(57) ABSTRACT

An encapsulated circuit assembly and methods for making an encapsulated circuit assembly for power delivery are disclosed. The assembly comprises a first printed circuit board, a second printed circuit board, and a mechanical coupler. The mechanical coupler is coupled between the first printed circuit board and the second printed circuit board and disposed between the first printed circuit board and the second printed circuit board. The mechanical coupler provides substantial electrical continuity between a trace on the first printed circuit board and a trace on the second printed circuit board.

24 Claims, 15 Drawing Sheets

U.S. PATENT DOCUMENTS

| | | | | |
|---|---|---|---|---|
| 5,729,433 A | * | 3/1998 | Mok | 361/704 |
| 5,734,555 A | * | 3/1998 | McMahon | 361/704 |
| 5,761,043 A | | 6/1998 | Salmonson | |
| 5,794,454 A | | 8/1998 | Harris et al. | |
| 5,796,582 A | | 8/1998 | Katchmar | |
| 5,801,924 A | | 9/1998 | Salmonson | |
| 5,815,921 A | | 10/1998 | Burward-Hoy | |
| 5,825,633 A | | 10/1998 | Bujalski et al. | |
| 5,842,514 A | | 12/1998 | Zapach et al. | |
| 5,856,911 A | | 1/1999 | Riley | |
| 5,864,478 A | | 1/1999 | McCutchan et al. | |
| 5,898,573 A | | 4/1999 | Fugaro | |
| 5,920,458 A | | 7/1999 | Azar | |
| 5,930,115 A | | 7/1999 | Tracy et al. | |
| 5,980,267 A | | 11/1999 | Ayers et al. | |
| 5,986,887 A | * | 11/1999 | Smith et al. | 361/704 |
| 5,995,370 A | | 11/1999 | Nakamori | |

* cited by examiner

INTER-CIRCUIT ENCAPSULATED PACKAGING FOR POWER DELIVERY

CROSS REFERENCE TO RELATED APPLICATIONS

This application is related to U.S. patent application Ser. No. 09/353,428, filed Jul. 15, 1999 by Joseph T. DiBene et al., entitled "INTER-CIRCUIT ENCAPSULATED PACKAGING," which application is incorporated by reference herein.

BACKGROUND OF THE INVENTION

1. Field of the Invention

This invention relates in general to a methodology to improve the packaging and distribution of power to electronic circuits, and also provides efficient means to purge any excess associated heat from such electronic assemblies. The present invention addresses these issues by encapsulating the circuitry within a circuit board structure which improves power distribution, thermal, mechanical and integrated circuit device management over existing technologies known in the art today.

2. Description of Related Art

As circuitry in electronics becomes more complex, packaging of the circuitry has become more difficult. The common method for packaging integrated circuits and other electronic components is to mount them on Printed Circuit Boards (PCBs).

Recently, the application of new organic laminates in the construction of Multi-Chip-Modules (MCMs) has brought about significant improvements in the packaging cost and density of electronic circuits. The circuit density of electronic circuits on silicon and other semiconductor materials continues to increase, along with an increase in the overall size of the semiconductor chip. This increase in density causes the total power level of many electronic chips to increase even though the operating voltage levels have decreased due to improvements in process fabrication. The net result has been a significant problem associated with the delivery of power to these devices.

Computer chip clocking speeds have also increased. This increase in speed has made it difficult to couple chips together in such a way that the internal chip speeds are completely useable, i.e., the I/O for a given chip typically cannot keep up with the internal chip speeds. Further, heat generated by integrated circuits has increased because of the increased speed and increased number of signals travelling through the integrated circuits. In addition, as die sizes increase interconnect delays on the dies are beginning to limit the circuit speeds within the dies. Typically, the limitations of a system are contributed to, in part, by the packaging of the system itself. These effects are forcing greater attention to methods of efficiently coupling and integrating high-speed integrated circuits.

Packaging the integrated circuits onto PCBs has become increasingly more difficult because of the signal density within integrated circuits and the requirements of power distribution and heat dissipation. Typical interconnections on a PCB are made using traces that are etched or pattern plated onto conductive layers of the PCB. To create shorter interconnections, Surface Mount Technology (SMT) chips, Very Large Scale Integration (VLSI) circuits, flip chip bonding, Application Specific Integrated Circuits (ASICs), Ball Grid Arrays (BGAs), and the like, have been used to shorten the transit time and interconnection lengths between chips on a PCB. However, this technology has not completely overcome the needs for higher signal speeds in both intra-PCB and inter-PCB structures because of power distribution considerations, thermal considerations, EMI concerns, and other packaging related problems.

In any given system, PCB area (also known as PCB "real estate") is at a premium. With smaller packaging envelopes becoming the norm in electronics, e.g., laptop computers, spacecraft, cellular telephones, etc., large PCBs are not available for use to mount SMT chips, BGAs, flip chips or other devices. Newer methods are emerging to decrease the size of PCBs such as build-up-multilayer technology, improved organic laminate materials with reduced thicknesses and dielectric constants, and laser beam photo imaging. These technologies produce greater pressure to maintain the functionality of the PCB assembly through power, thermal, and Electromagnetic Interference (EMI) management to the semiconductor devices.

It can be seen, then, that there is a need in the art for a method for decreasing the size of PCBs while maintaining the functionality of PCBs. Further, there is a need for reducing the size of PCBs while using present-day manufacturing techniques to maintain low cost packaging. It can also be seen that there is a need in the art for techniques to deliver power to devices without degrading the performance of the overall system.

SUMMARY OF THE INVENTION

To overcome the limitations in the prior art described above, and to overcome other limitations that will become apparent upon reading and understanding the present specification, the present invention discloses an encapsulated circuit assembly which utilizes printed circuit boards as a foundation for the assembly structure. The assembly comprises a first printed circuit board, a second printed circuit board, and a mechanical coupler. The mechanical coupler is coupled between the first printed circuit board and the second printed circuit board and disposed between the first printed circuit board and the second printed circuit board. The mechanical coupler provides substantial electrical continuity between a trace on the first printed circuit board and a trace on the second printed circuit board.

An object of the present invention is to provide method for decreasing the size of PCBs while maintaining the functionality of PCBs. Another object of the invention is to improve the distribution of high power and low voltage to integrated circuit assemblies. Another object of the present invention is to provide techniques to deliver power to devices without degrading the performance of the overall system.

These and various other advantages and features of novelty that characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of methods and apparatuses in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention discloses an encapsulated circuit assembly and methods for making such an assembly. The assembly comprises a first printed circuit board, a second printed circuit board, and a mechanical coupler. The mechanical coupler is coupled between the first printed circuit board and the second printed circuit board and disposed between the first printed circuit board and the second printed circuit board. The mechanical coupler provides substantial electrical continuity between a trace on the first printed circuit board and a trace on the second printed circuit board.

The present invention provides a method and apparatus for mounting devices, typically integrated circuit devices, onto the first PCB and efficiently delivering low voltage, high current power to these integrated circuit devices. In addition, the present invention provides, where necessary, for the removal of the heat from those devices that generate large amounts of heat. The present invention allows for air cooling, heat pipe cooling, or other methods of cooling devices, as well as a compact packaging design to allow for heat generating devices to be packaged into small volumes. Furthermore, the present invention can be expanded to provide beneficial aspects to containment of electromagnetic interference and electronic signal interconnects between devices.

Encapsulated Circuit Assembly

Figure 1:
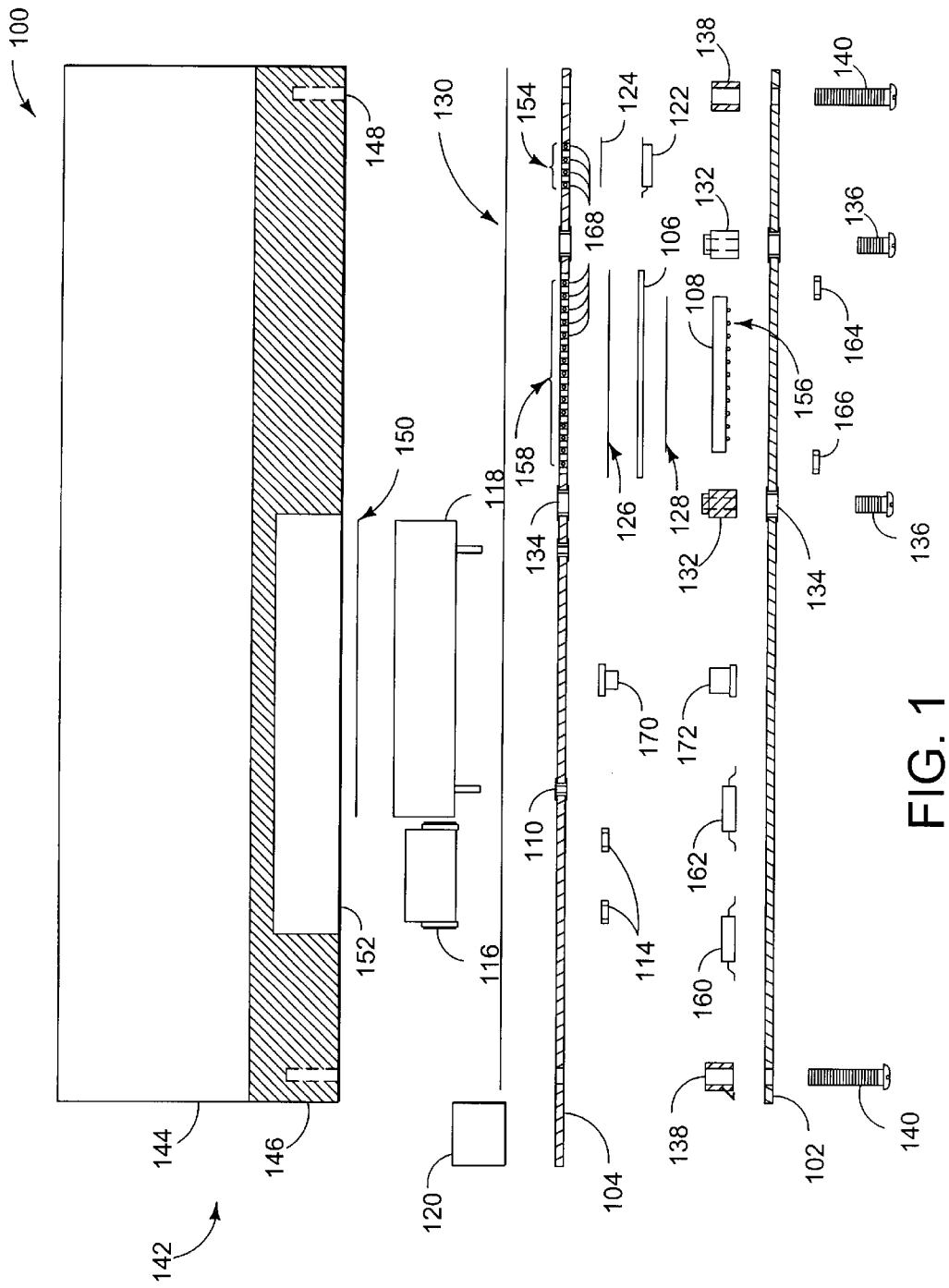
FIG. 1 is a 2-dimensional sectional exploded view illustrating the construction of a printed circuit board assembly using the present invention.
Figure 2:
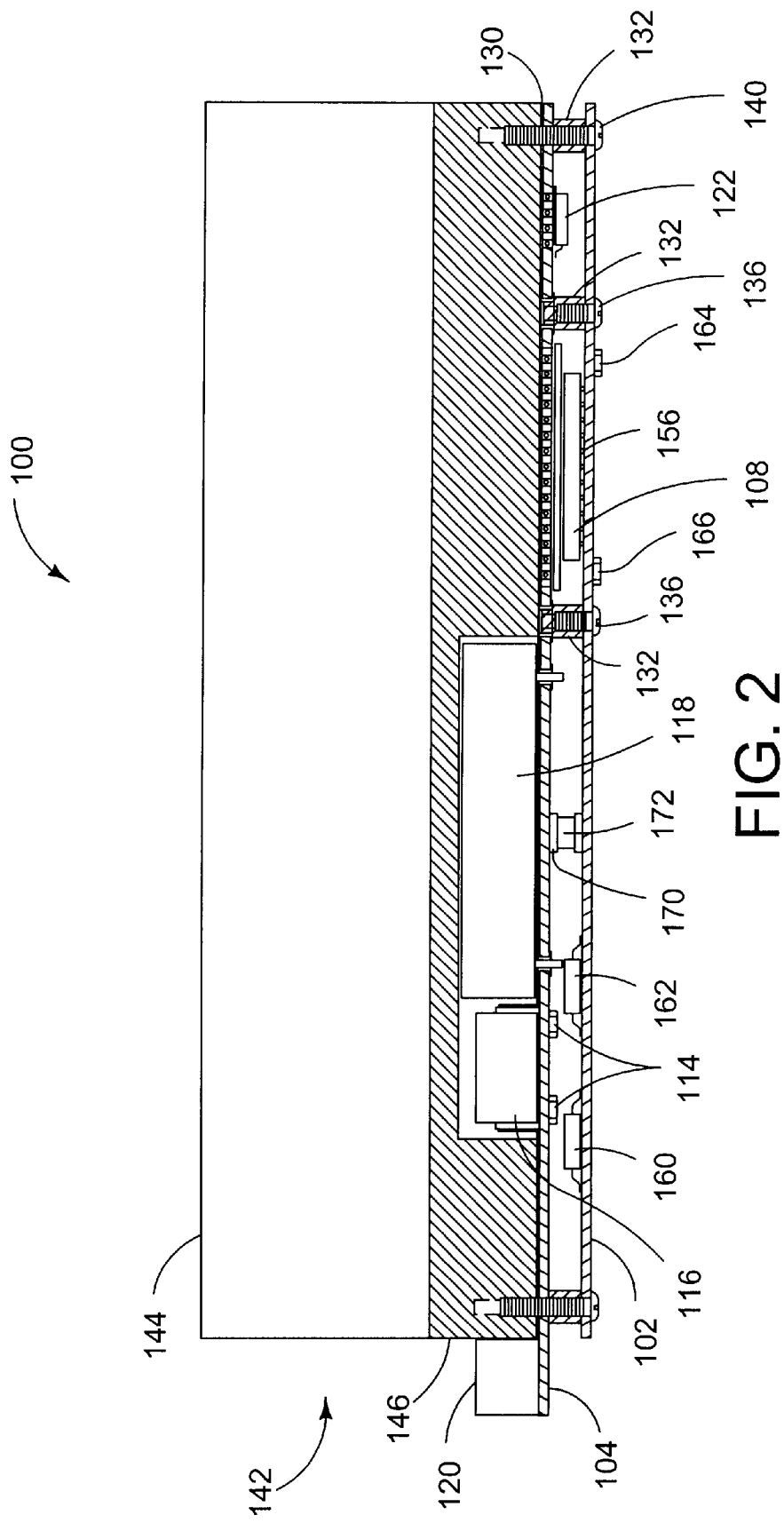
FIG. 2 is a 2-dimensional assembled view illustrating the construction of a printed circuit board assembly using the present invention.
Figure 3:
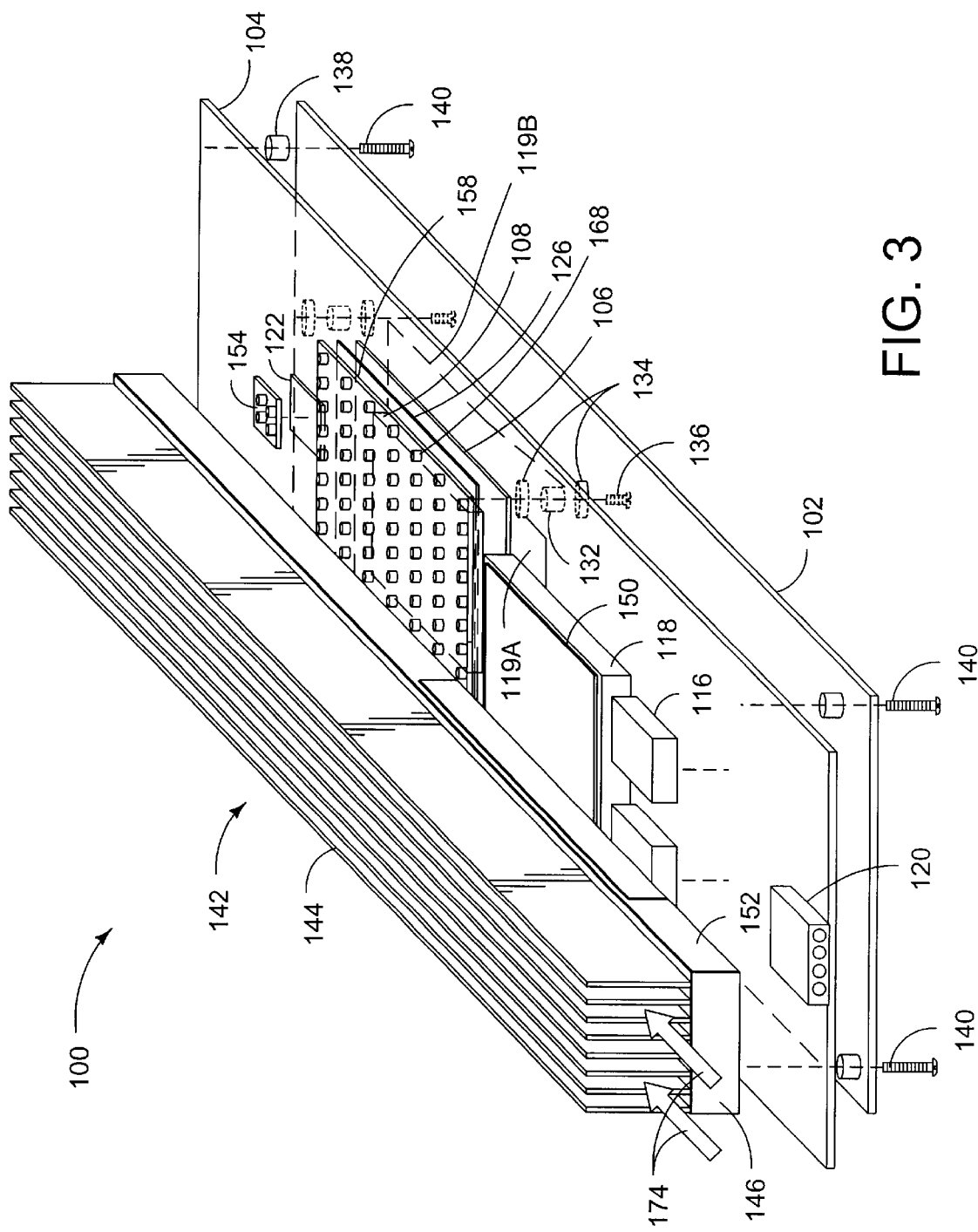
FIG. 3 is a 3-dimensional exploded view illustrating the construction of a printed circuit board assembly using the present invention.

FIGS. 1, 2 and 3 illustrates the construction of an encapsulated circuit assembly using the present invention. FIG. 1 illustrates an exploded view of assembly 100. Assembly 100 comprises first printed circuit board (PCB) 102, second PCB 104, and heatsink assembly 142. First PCB 102 can be a single layer PCB or multi-layer PCB, where the multi-layer PCB is comprised of alternating layers of conducting and substantially non-conducting materials to allow electrical signals to be routed from device to device on the first PCB 102. Although the description of the present invention refers to PCBs 102 and 104, such reference to PCB 102 and PCB 104 also includes technologies associated with MCMs.

Devices 160–164 are shown mounted on first PCB 102. Devices 164 and 166 are shown as being mounted on the opposite side of first PCB 102 as devices 160 and 162. This illustrates that first PCB 102 can have devices 160–166 mounted on both sides. Furthermore, PCB 104 can have devices mounted on both sides as well.

Device 108 is coupled to first PCB 102 via a Ball Grid Array (BGA) 156. BGA 156 provides electrical contacts between device 108 and first PCB 102. Other methods of electrical coupling between device 108 and first PCB 102 are possible, e.g., wire bonding, solder connections, etc. Further, there can also be thermal coupling between device 108 and PCB 102 if desired. The present invention also allows for multiple occurrences of device 108 to be mounted on PCB 102 and supplied with power by one or more power converters 118.

Heat Transfer

Heat transfer device 128 couples device 108 to heatspreader 106. Heatspreader 106 is typically a high conductance metal plate constructed of copper or other similar materials. Heatspreader 106 spreads the heat emanating from device 108 to a larger area, making the removal of heat through PCB 104 to heatsink assembly 142 more efficient. Heatspreader 106 also equalizes the height of various devices mounted on PCB 102 to thermally couple such devices 108 to PCB 104. If all devices mounted on PCB 102 that are coupling heat to PCB 104 are of the same or similar height it may be possible to eliminate the need for heat transfer device 128 and heatspreader 106.

Heat transfer device 128 is typically a thermally conductive thermal setting material, e.g., thermal epoxy, paste, or film. Heat transfer device 128 provides a thermal interface between device 108 and the heatspreader 106, or, when heatspreader 106 is not required, heat transfer device 128 provides a thermal interface between device 108 and PCB 104. Heat transfer device 128 is typically a mechanically non-compliant material. Heatspreader 106 is typically applied to device 108 though the use of heat transfer device 128 prior to the assembly of PCB 102 and PCB 104.

Heat transfer device 126 couples heatspreader 106, heat transfer device 128 and device 108 to second PCB 104. Heat transfer device 126 is typically a mechanically compliant, thermally conductive material such as thermal grease which allows for minimally applied pressure and/or shear force to the device 108 such that the device 108 and its associated BGA 156 are not subjected to additional stress. Note that if heatspreader 106 and heat transfer device 128 are not required then heat transfer device 126 is used to couple device 108 directly to second PCB 104.

Second PCB 104 has area 158 that is designed to facilitate the transfer of heat through PCB 104. Area 158 comprises plated through holes (PTHs) 168, consisting of holes in board 104 with interior walls of plated copper or other high thermally conductive material. In addition, the region within the hole may be filled with metal or other thermally conductive material to enhance thermal conduction through PCB 104. Areas 158 can be designed to be the same size, a larger size, or a smaller size than heatspreader 106 depending on the heat dissipation requirements for device 108 and the size of second PCB 104.

PTHs 168 also reduce the size and number of air pockets in heat transfer device 126 and to provide a volume where excesses of heat transfer device 126 may flow in the case of a reduced gap between device 108 and board 104. PTHs 168 can be adjusted in size and number to vary the thermal conductivity of the paths of multiple devices 108 on a single first PCB 102 to the common "isothermal" heatsink assembly 142. For example, if two devices 108 have different heat flows, then the conductivity in each thermal path can be adjusted such that the junction temperature of each device 108 will be the same. This can be beneficial in improving timing margins of digital devices.

Power and Signal Delivery and Board-to-Board Connections

Spacers 132 and fasteners 136 provide for a precision alignment between PCB 102 and PCB 104 and the device 108, heat transfer device 128, and heatspreader 106 such that a controlled gap exists in which heat transfer device 126 can properly be accommodated without deleterious air gaps nor excessive pressure applied to device 108 and BGA 156. Additionally, the location of the spacers 132 adjacent to the device 108 reduce variations in spacing caused by bow and warpage of PCB 102 and, to some extent, PCB 104. Spacers 132 and fasteners 136 also may provide a power or signal delivery path from PCB 104 to PCB 102 and device 108.

Typically, power converters and power filtering components are mounted on PCB 102. The present invention allows for power converters and power filtering components to be mounted on PCB 104 and route the high currents required by device 108 through low impedance etch paths 119A, also called traces, on PCB 104 and through spacers 132 and fasteners 136 to PCB 102. The spacers 132 can thus be located proximate to device 108, which reduces the current carrying requirements of PCB 102 from utilizing thick copper planes or traces to route power efficiently to device 108. Thus, the conductive circuit traces 119B of PCB 102 can be optimized for high-speed signal interconnects without compromising the trace design to handle high power delivery.

The present invention also frees up valuable and costly board space on PCB 102. Additionally, the present invention allows for similar devices 108 to be more closely coupled to each other because the power components 114, 116, and 118 are not competing for the same PCB real estate as devices 108. This improves the signal interconnect delays and permits faster operation of interconnected devices 108. Many variations of spacers 132 and fasteners 136 can be used to deliver signals, and can be used in combination or as a homogeneous type per assembly 100. Each type of spacer 132 and fastener 136 has assembly, performance, and cost benefits associated with it as described herein.

Power converter 118, power filtering components 116 and 114, and power delivery connector 120 all connect to PCB 104. The power output of converter 118 connects to pads 110 on PCB 104 and to power standoff pad assemblies 134 located on PCB 104 and PCB 102 through conductive power etch patterns on PCB 104. These power standoff pad assemblies provide a power interface between PCB 102, PCB 104 and spacer 132.

The present invention allows for power components 114, 116 and/or other radiative devices, to be placed on the top of PCB 104 close to power converter 118 and surrounded by heatsink base 146. This allows for better delivery of power to device 108, as well as assisting in the shielding of such devices to contain the electromagnetic fields that radiative devices such as power components 114 and 116, and power converter 118 create.

Although power delivery connector 120 is shown mounted on PCB 104 because this is the most direct connection to power converter 118 and power filtering components 116 and 114, alternative locations of connector 120 are possible, e.g., mounting power delivery connector on PCB 102.

Because it is desirable to have converter 118 share a common heatsink structure for all heat dissipating components of assembly 100, a cavity 152 is provided in heatsink base 146 of heatsink assembly 142. Cooling fins 144 may be separate structures that are pressed into base 146, or may be an integral part of a common extrusion. The depth of cavity 152 is slightly greater than the combined height of converter 118 and thermal interface 150. Converter 118 is first joined mechanically and thermally to the cavity 152 of heatsink assembly 142 using thermal interface 150.

Where height and thermal conditions allow, power components 114, 116 and/or 118 may be mounted on the bottom side of PCB 104. Similarly, power components 114, 116 and/or 118 may be mounted on PCB 102 and thermally cooled in a manner similar to device 108 wherever space is available, to allow the radiative devices to utilize the shielding properties of the present invention.

PCB 104, and components 120, 116 and 114, are then coupled to heatsink assembly 142 using heat transfer device 130 with appropriate relief areas as needed. The leads of converter 118 which are projecting through circuit pads 110 of PCB 104 are then soldered forming a completed assembly which can be joined to PCB 102. Although shown as a finned heat sink, heatsink assembly 142 can be any device, e.g., a heat pipe, or any other thermal structure capable of removing heat to the environment. Thermal interface 130 can be electrically conductive, or non-electrically conductive, depending on the design for second PCB 104 and the overall EMI design of assembly 100. Thermal interface 130 can be thermal epoxy or any other material which thermally and mechanically bonds second PCB 104 to heatsink assembly 142.

Power converter 118 can be provided with a separate heatsink that might project through a clear cavity in heatsink assembly 142. In such a case power converter 118 could be mounted directly to PCB 104 and heatsink assembly 142 could be attached to PCB 104. Additionally, power converter 118 can be mounted on primary PCB 102, and cooled in a similar manner as device 108.

Second PCB 104 is mechanically coupled to first PCB 102 through the use of fasteners 140 and standoffs 138. The standoffs 138 are typically thicker than a layer of the PCB 102 or PCB 104 to allow for devices 108 to be mounted between PCB 102 and PCB 104. Fasteners 140 are typically screws, but can be other types of fasteners such as rivets, hollow feedthroughs, connectors, or other fasteners. Standoffs 140 are typically unthreaded inserts with a height equal to the height of spacer 132. The fasteners 140 and standoffs 138 are located at mechanically and/or electrically desirable locations on first PCB 102. These locations are typically at the periphery of first PCB 102, but can be anywhere on first PCB 102. Fasteners 140 and standoffs 138 provide substantially electrically conductive paths between PCB 102 and PCB 104 where desired.

Board-to-board stacking connectors 170 and 172 illustrate another means by which signals may be conveyed from PCB 102 to PCB 104. Such signals may include power control, power sense signals, data signals, or other signals that a designer wants to pass between PCB 102 and PCB 104. Further, more than one occurrence of connectors 170 and 172 may be utilized, as required, to satisfy signal interconnect requirements between PCB 102 and PCB 104. Connectors 170 and 172 may be used to supply auxiliary power to devices similar to device 108 but where electrical demands are not as stringent in the delivery of power to said devices.

The advantage of the electrical power interconnect of the present invention is that designs can now be produced with lower impedance paths between the output of the power module 118 and the devices 108. For high current devices, the IR drops across a PCB 102 may be significant. Although many of today's power modules 118 offer remote sense capabilities, the heat absorbed in the planes of a PCB 102 increases thermal dissipation problems at the system and board levels. Second, lower voltage drops between power module 118 and device 108 allow for signal margins at the system level. When a single power converter 118 supplies power to more than one device 108, the routing of the power can be designed to have low IR losses in the traces on PCB 104, typically in an equi-resistive fashion, to balance the thermal and power on PCB 104.

PCB Design Issues

Multi-layer PCBs with thick power and ground layers for power distribution are costly to manufacture and difficult to produce in high yields. Thus, thinner layers, typically 0.5 to 1.0 ounce layers, are used for the conductive paths on a PCB, which increases the resistance of the layer and the resulting traces created on that layer. Further, the resistance increases as the trace width narrows, which is required for densely populated boards with large numbers of devices 108, which perforate the power and ground planes with other signals and traces, vias, etc. By moving the power module 118 to a separate but physically proximate location, and using "drops" for power to each device 108, heavy ground and power layers can be used, since the traces are not interrupted by other devices 108 on the secondary PCB 104. These heavy copper power and ground layers enable low electrical resistance, with little interruption of etch due to vias, across the secondary PCB 104. This, in turn with the close proximity to device 108 connector 118, affords the power interconnect with a low resistance path.

Power dissipating component 122 which may consist of a voltage regulator, zener diode, or other power regulating or generating device, may also be mounted onto PCB 104 with heat transfer area 154 and PTHs 168 similar to area 158. Device 122 is then thermally attached to PCB 104 using heat transfer device 124 which may consist of solder or other thermally conductive materials. Thus, assembly 100 allows for heat to also be removed from device 122 through heat transfer device 124, heat transfer area 154 and heat transfer device 130 to the common heatsink assembly 142.

FIG. 2 illustrates the assembly 100 as a completed assembly. The thermal coupling of device 108, heat transfer device 128, heatspreader 106, heat transfer device 126, second PCB 104 in conjunction with PTHs 168, thermal interface 130, and heatsink assembly 142 provide a thermal path for heat generated by device 108 to be dissipated by heatsink assembly 130. Further, airflow can be provided to further cool device 108 and devices 160–162. Although shown as covering the entire area of second PCB 104, heatsink assembly 142 can be larger or smaller than the area of second PCB 104. Heatsink assembly 142 also acts as a mechanical stabilizer for assembly 100, to provide additional mechanical stability for assemblies 100 that will experience more severe mechanical environments, e.g., vibration.

FIG. 3 illustrates assembly 100 in an isometric view. Heatsink assembly 142 is shown as smaller than second PCB 104 and thermal interface 150 is deleted to more effectively illustrate the design of the present invention. Airflow 174 can again be provided to increase the heat dissipation capabilities of assembly 100.

Embodiments Of The Present Invention

Figure 4:
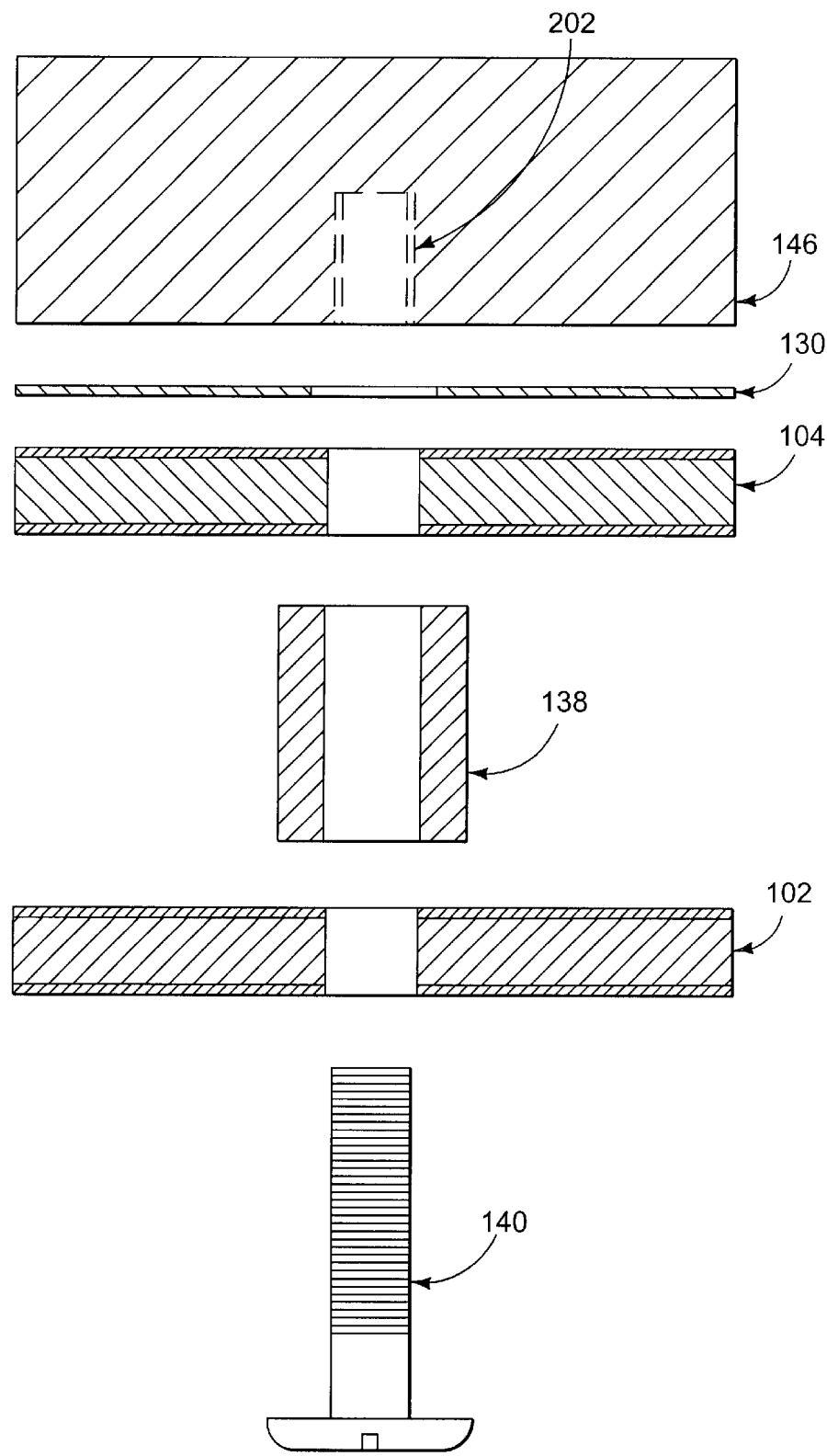
FIG. 4 illustrates simple mechanical standoff assembly useful as a spacer in the printed circuit board assembly of the present invention.

FIG. 4 illustrates one embodiment of the present invention that implements standoffs useful for mechanically coupling PCB 104 to PCB 102. A tapped hole 202 in heatsink base 146 receives fastener 140. Unthreaded standoff 138 may desirably be secured to PCB 104 or PCB 102 by soldering to surface etch prior to joining PCB 102 and PCB 104 to ease assembly.

Figure 5:
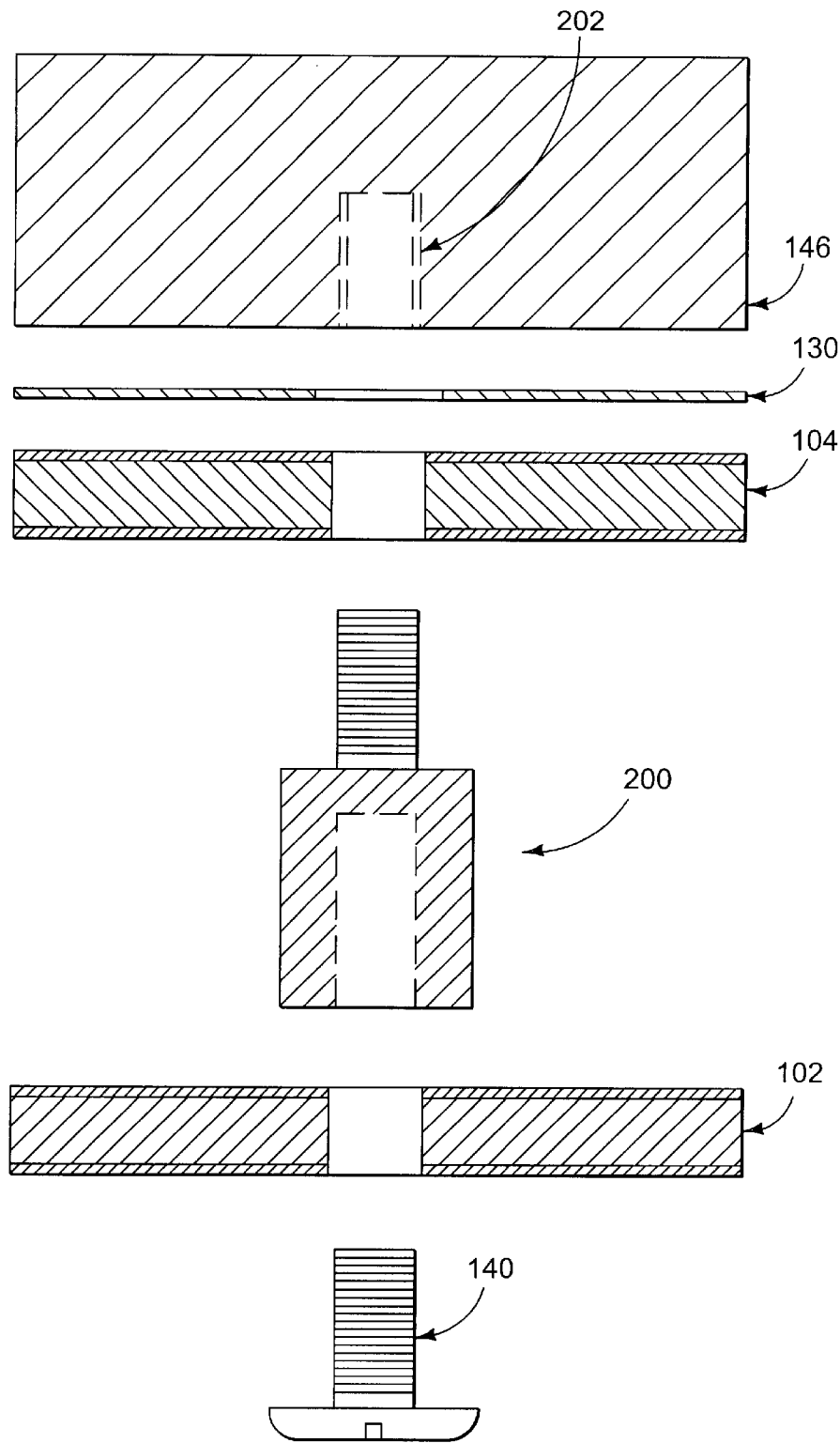
FIG. 5 illustrates an alternate mechanical standoff assembly useful as a spacer in the printed circuit board assembly of the present invention.

FIG. 5 is similar to FIG. 4 but utilizes male-female standoff 200 which can be used to join PCB 102 to heatsink base 202 prior to assembly of PCB 102 with fastener 140, negating the need to solder or otherwise affix the standoff 200 prior to assembly of PCB 102 and PCB 104.

Figure 6:
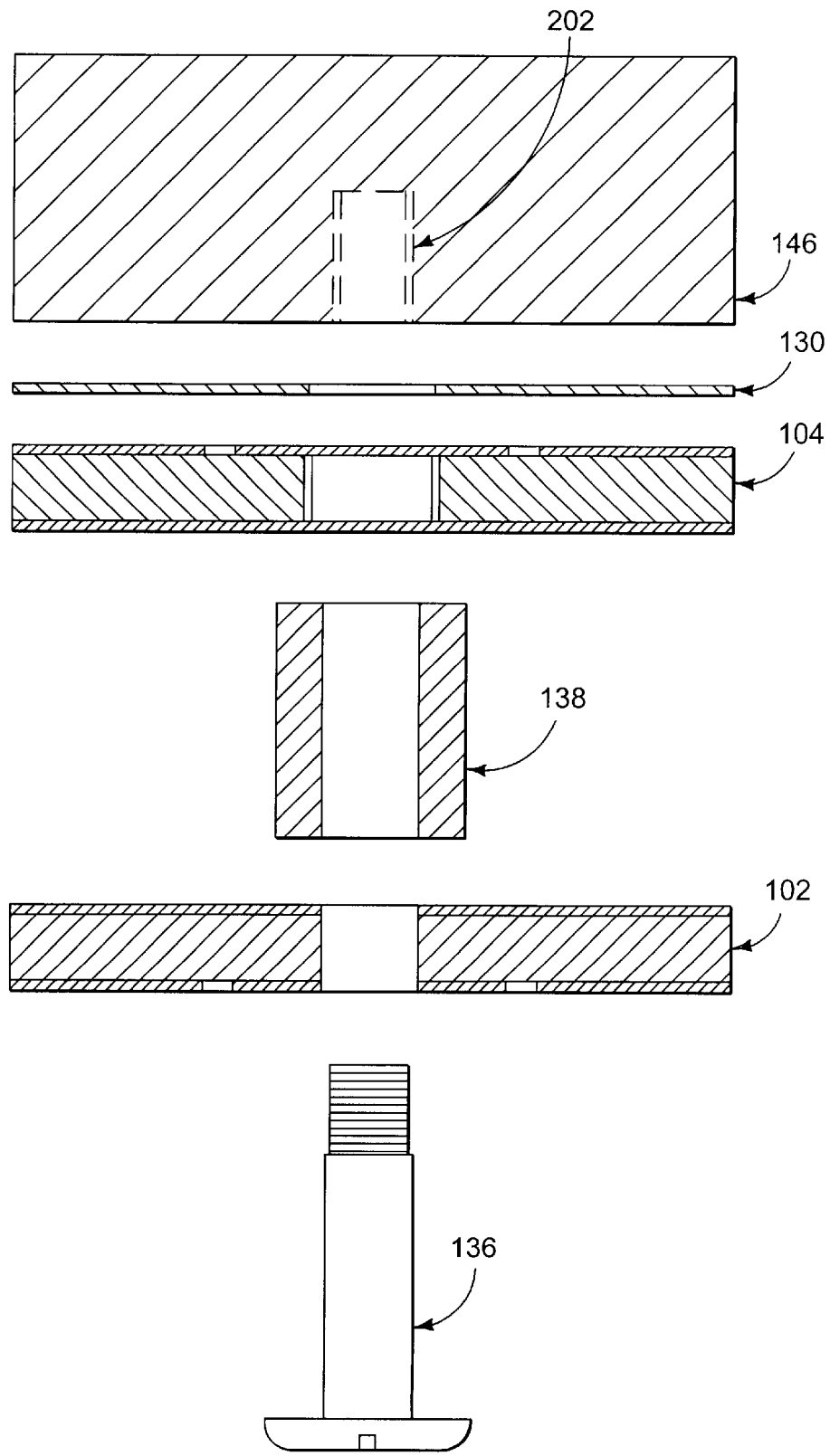
FIG. 6 illustrates a method by which the simple mechanical standoff assembly of FIG. 4 may be adapted for use as a power feed and spacer in the printed circuit board assembly of the present invention.

FIG. 6 illustrates an unthreaded standoff 138 that may be used to route power from the lower conductive pattern of PCB 104 to the upper conductive pattern of PCB 102 in accordance with the present invention. Electrical isolation of the fastener 204 from the electrical path of standoff 138, fastener 204 is outfitted with an insulating sleeve. The hole in PCB 102 is unplated, which isolates the fastener 204 head from the upper etch of PCB 102.

Figure 7:
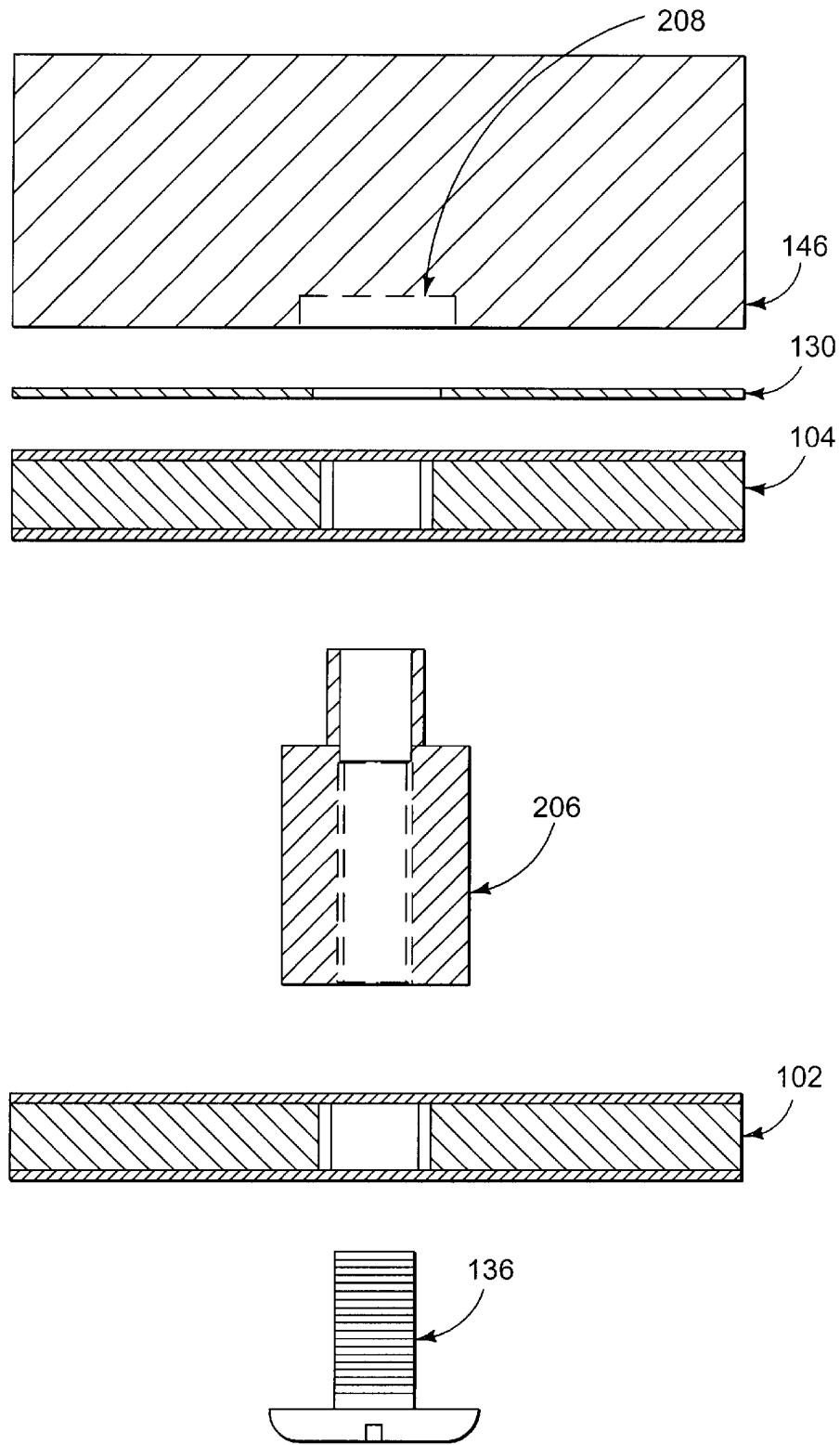
FIG. 7 illustrates a method by which a swaged standoff may be used as a power feed and spacer in the printed circuit board assembly of the present invention.

FIG. 7 illustrates a threaded standoff 206 that may be used to route power from conductive patterns on PCB 104 to conductive patterns on PCB 102 in accordance with the present invention. The standoff 206 is installed into the hole of PCB 104 and then swaged and soldered to PCB 104. In order to accommodate the swage portion of standoff 206 extending above the upper surface of PCB 104, a relief is provided in heatsink base 208 and a cutout is provided in thermal interface 130. Because fastener 136 does not engage the heatsink base 146, thermal interface 130 should form a secure bond between the upper surface of PCB 104 and heatsink base 146. Thermal interface 130 may be thermal setting thermally conductive epoxy sheet, or other suitable material.

Figure 8:
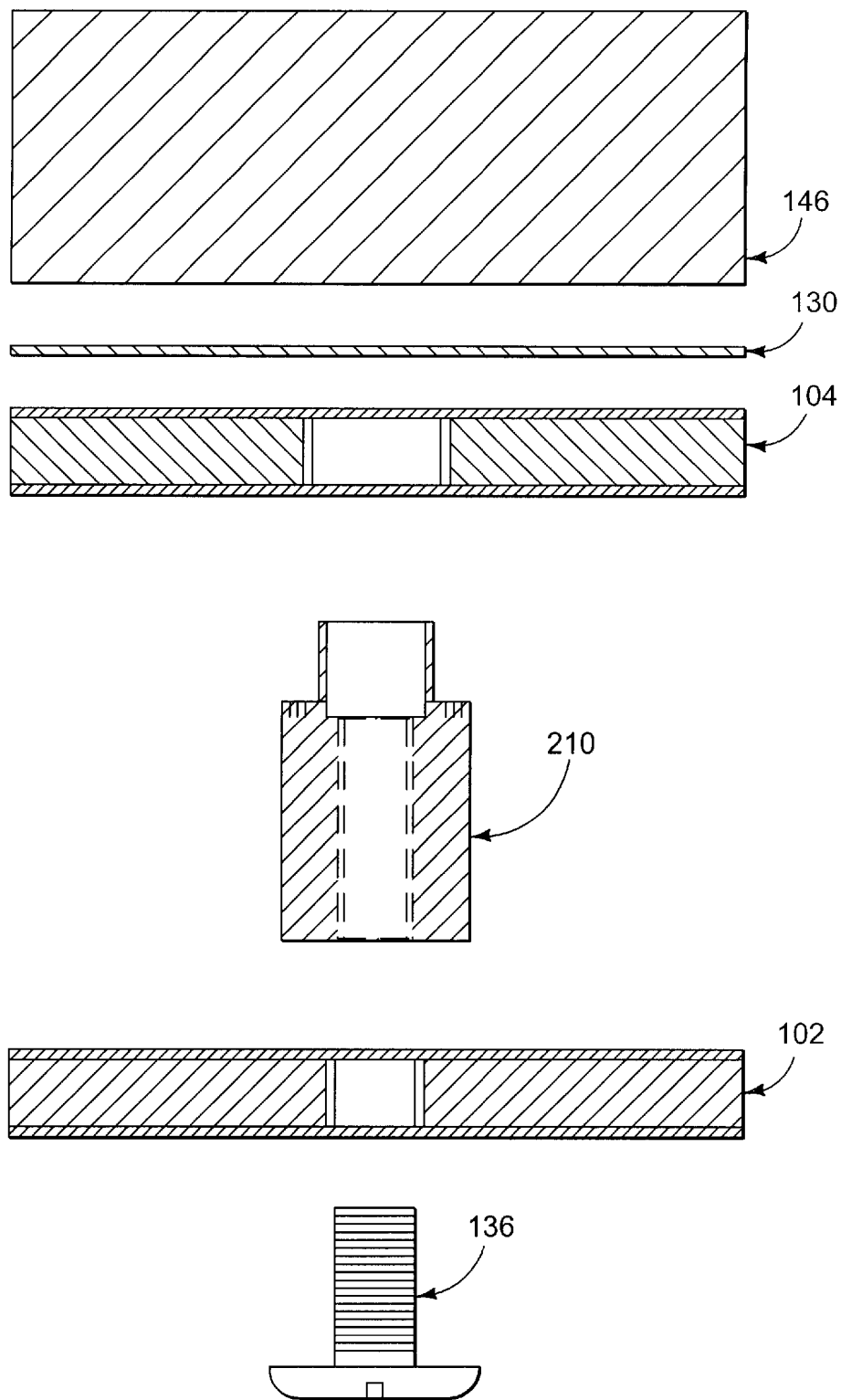
FIG. 8 illustrates a method by which a self expanding standoff may be used as a power feed and spacer in the printed circuit board assembly of the present invention.

FIG. 8 illustrates a threaded self-expanding standoff 210 that is installed into a plated-through-hole in PCB 104 to route power from conductive patterns on PCB 104 to conductive patterns on PCB 102. A commercially available standoff similar to standoff 210 is manufactured by Penn Engineering as type KPS6, but other similar standoffs 210 may be used. Since standoff 210 can be designed to not extend beyond the upper surface of PCB 104, heatsink base 146 does not require a relief, nor does thermal interface 130 require a cutout. Further, since fastener 136 does not engage the heatsink base 146, thermal interface 130 should form a secure bond between the upper surface of PCB 104 and heatsink base 146. Thermal interface 130 may be thermal setting thermally conductive epoxy sheet, or other suitable material.

Figure 9:
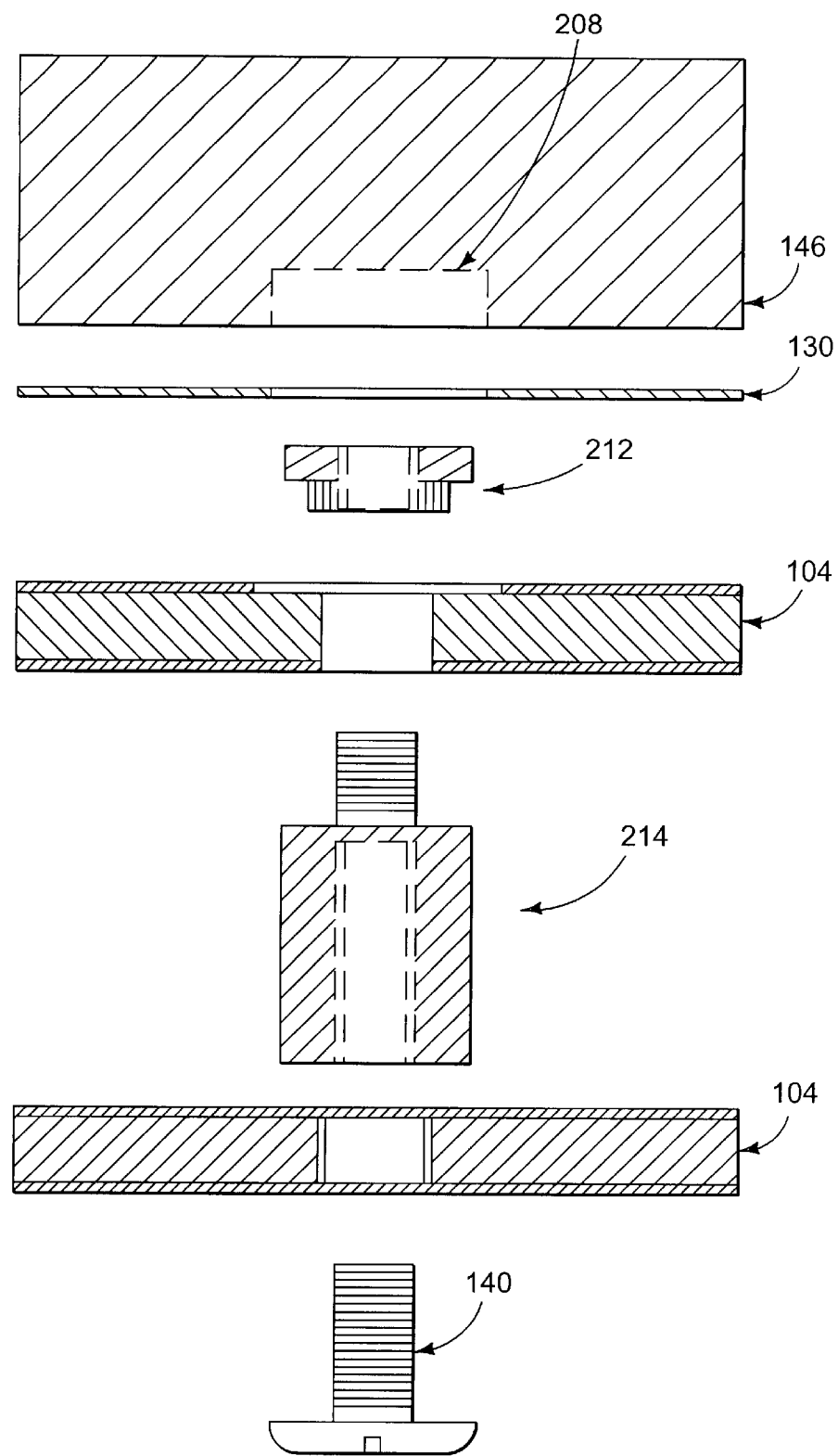
FIG. 9 illustrates a method by which a press nut in conjunction with the standoff illustrated in FIG. 5 may be used as a power feed and spacer in the printed circuit board assembly of the present invention.

FIG. 9 illustrates a threaded knurled nut 212 that is pressed into an unplated hole in PCB 104 to route power from a lower conductive pattern of PCB 104 to conductive patterns on PCB 102 in accordance with the present invention. Threaded male-female standoff 214 is threaded into nut 212 to provide both electrical and mechanical properties to the interface between PCB 102 and PCB 104. To accommodate the upper portion of nut 212 that extends above the upper surface of PCB 104, a relief is required in heatsink base 208 as well as a cutout in thermal interface 130. Since fastener 136 does not engage the heatsink base 146, thermal interface 130 should form a secure bond between the upper surface of PCB 104 and heatsink base 146. Thermal interface 130 may be thermal setting thermally conductive epoxy sheet, or other suitable material.

Coaxial and Multi-axial Embodiments

Figure 10:
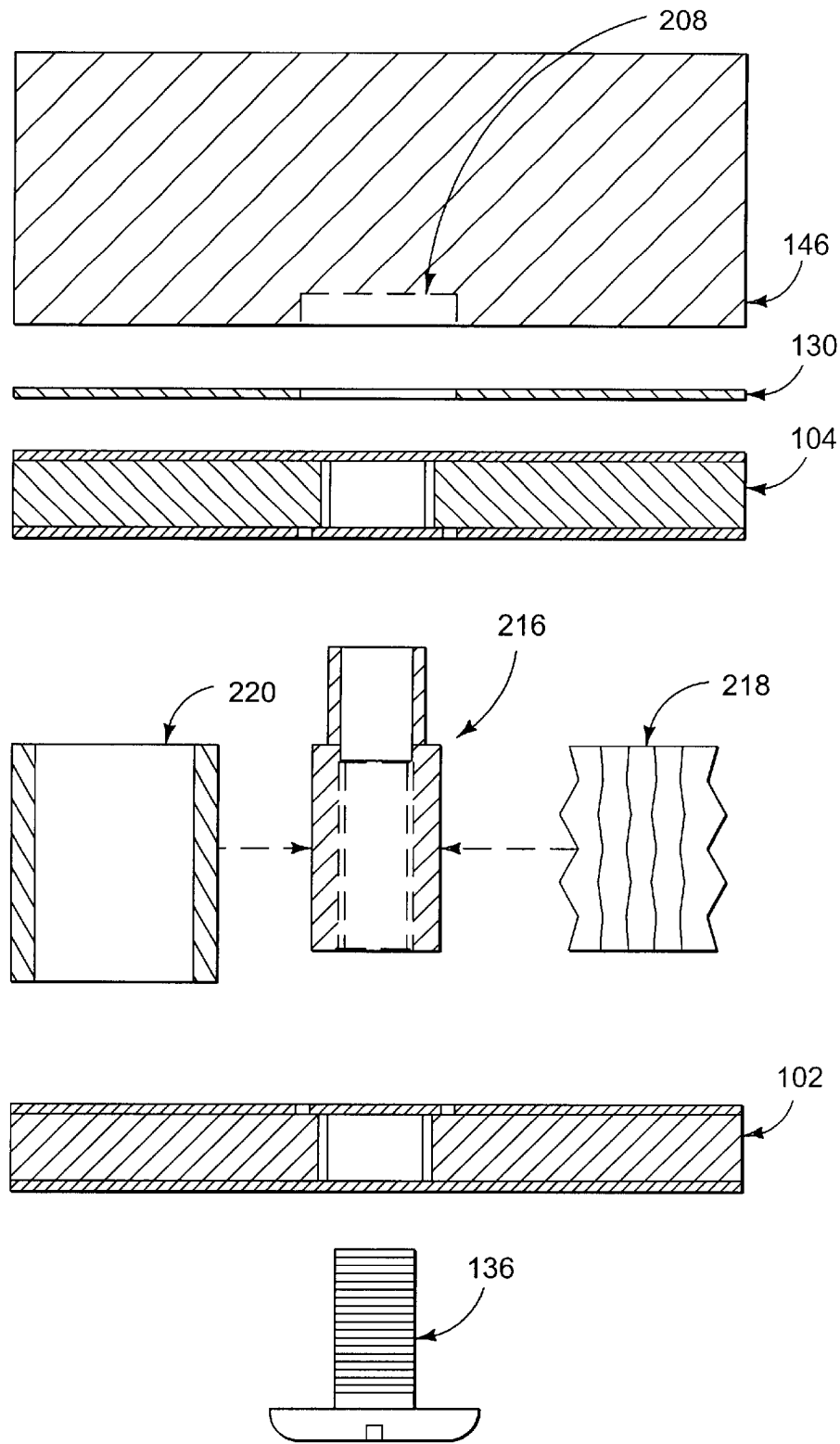
FIG. 10 illustrates a method by which a swaged standoff may be used in conjunction with an outer cylinder as a coaxial power feed and spacer in the printed circuit board assembly of the present invention.

FIG. 10 illustrates a coaxial power feed that can be implemented to route power and/or signals from PCB 104 to PCB 102 in accordance with the present invention. An inner conductor is formed by using a threaded conductive standoff 216 that is swaged and soldered to PCB 104, as described in FIG. 7. This standoff 216 is installed into a PTH in PCB 104. The PTH and the surrounding top and bottom pads on PCB 104 comprise the inner coaxial power circuit. The inner power coaxial circuit is completed by the screw 136 to a power pad on PCB 102. The height of standoff 216 is slightly less than the height of the outer unthreaded conductive standoff 220. A non-conductive plastic sleeve 218 embraces standoff 216. Outer unthreaded standoff 220 is then installed over plastic sleeve 218. Plastic sleeve 218 loosely holds standoff 220 in place with respect to inner standoff 216 to ease assembly of PCB 102 to PCB 104. It should be noted that outer standoff 220, sleeve 218 and inner standoff 216 can be a subassembly that is in place prior to the installation of inner standoff 216 to PCB 104.

Outer standoff 220 forms the outer coaxial power circuit engaging power pad patterns on PCB 102. Fastener 136 is used to press outer standoff 220 to PCB 102 and to complete the inner power circuit to etch patterns on PCB 102. Because the inner standoff 216 is slightly shorter than the outer standoff 220 both circuits feeds have identical and predictable joining forces between PCB 102 and PCB 104. Such would not be the case if the two standoffs were of approximately equal length where slight variations in length may cause an unpredictable shift in forces between the two standoffs as they press against the surfaces of PCB 102 and PCB 104. A coaxial power feed between PCB 102 and PCB 104 greatly reduces the unwanted electric and magnetic fields that might be created from electric disturbances induced into the power feed by device 108.

Although described with respect to coaxial systems, the present invention can be extended to more than two signals using multiple outer standoffs 220. The present invention can use compliant members, or other pressure regulating techniques, to allow for multiple signals to travel on the standoffs 216 and 220 between PCB 102 and PCB 104.

Figure 11:
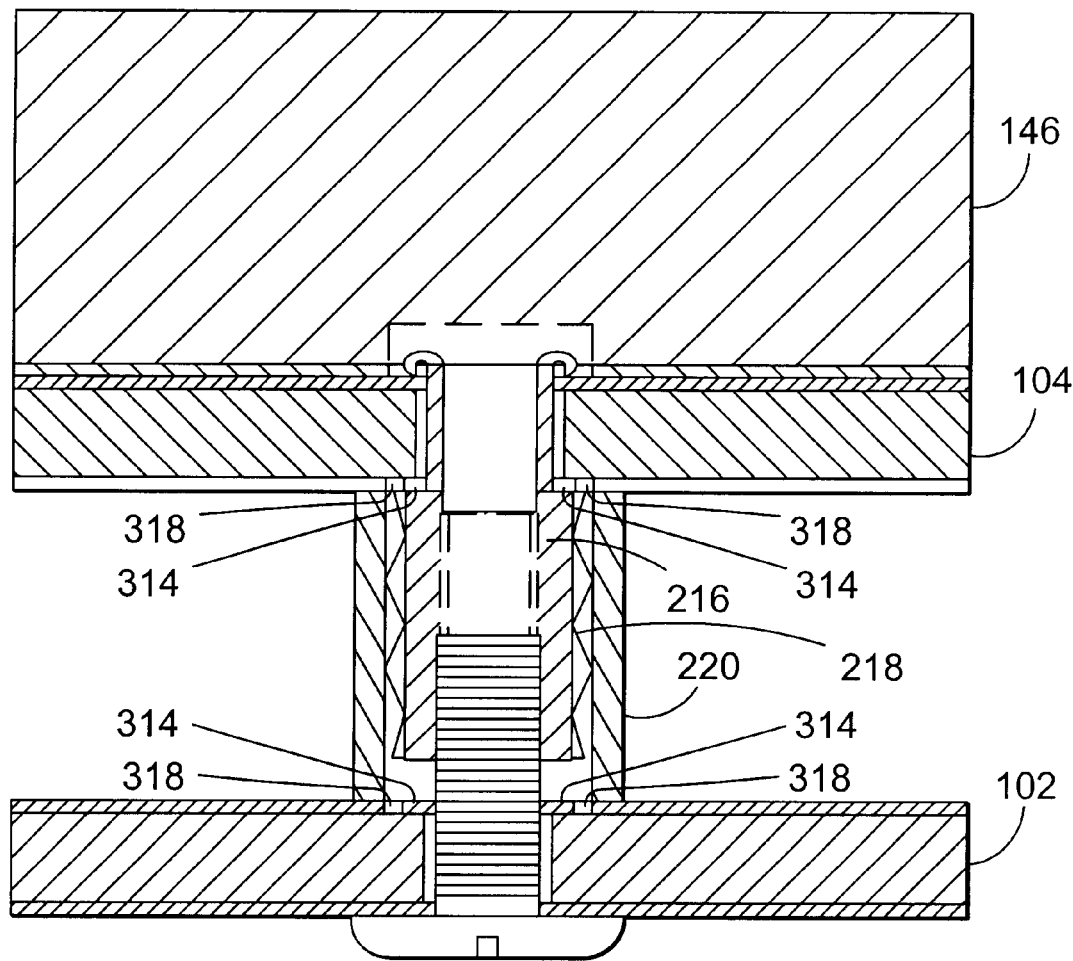
FIG. 11 is an assembled view of the elements of FIG. 10.
Figure 12:
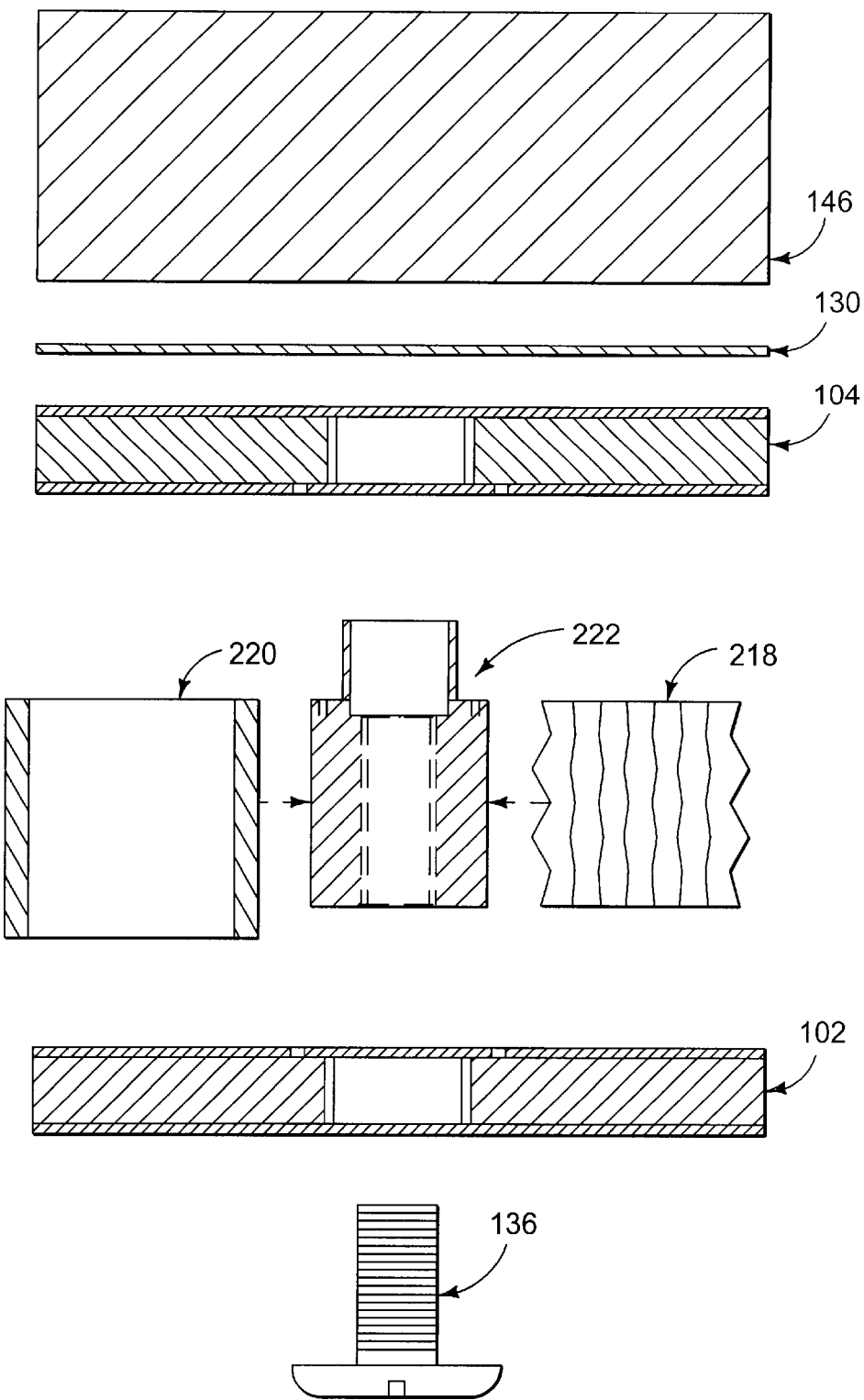
FIG. 12 illustrates a method by which a self expanding standoff may be used in conjunction with an outer cylinder as a coaxial power feed and spacer in the printed circuit board assembly of the present invention.
Figure 13:
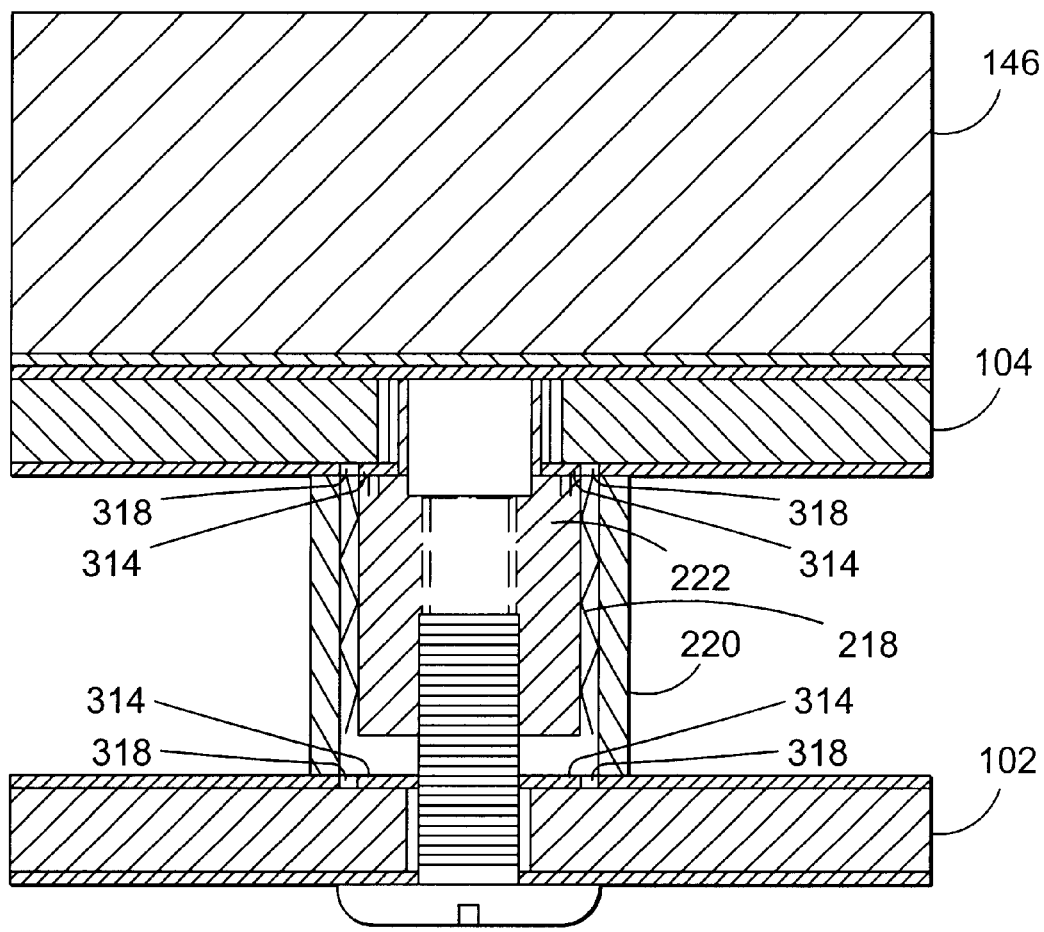
FIG. 13 is an assembled view of the elements of FIG. 12.

FIG. 11 illustrates the components described in FIG. 10 in a fully assembled configuration. FIG. 12 is similar to FIG. 10 except it utilizes a self-expanding threaded standoff 222 similar to that described in FIG. 8. FIG. 13 illustrates the components of FIG. 12 in a fully assembled configuration.

Power Circuit Pad Assembly

Figure 14A:
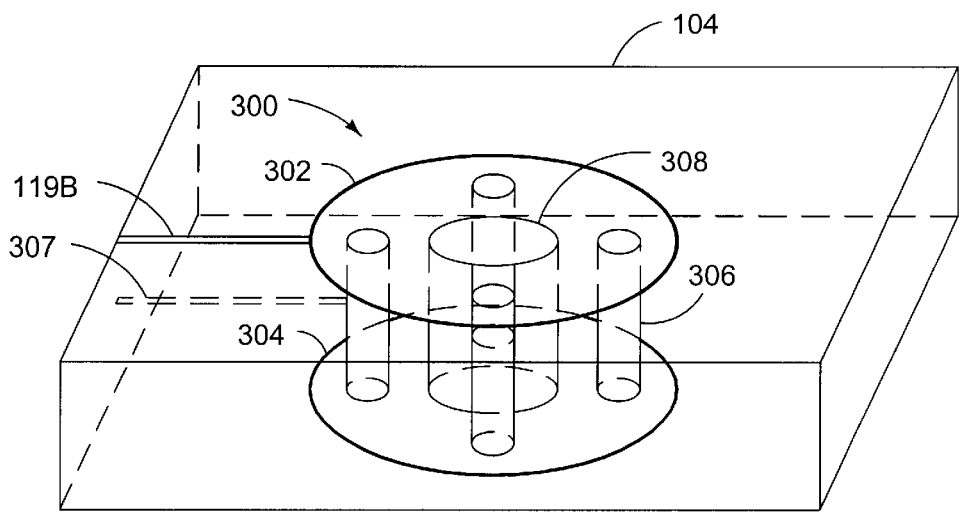
FIGS. 14A–14B illustrate power standoff PCB pad assemblies for use with the power standoffs of the present invention.

FIG. 14A illustrates power circuit pad assembly 300 that can be used to interface power circuits on PCB 102 and PCB 104 to non-coaxial power standoff arrangements such as described in FIGS. 6–9. The contact pad 304 that interfaces to the power standoff 138, 206, 210, or 216 is joined electrically to pad 302 through multiple occurrences of power vias 306. Power vias 306 provide multiple paths for power current to flow from pad 302 to pad 304 reducing the electrical impedance of the path and increasing the reliability. Although four occurrences of power vias 306 are shown, any number of vias 306 may be used. Inner PTH 308 receives the fastener or central portion of the standoff 138, 206, 210, or 216 as it passes through PCB 102 or PCB 104 and acts as an additional power path between pads 302 and 304. Inner circuit layers of PCB 102 or PCB 104 307 may be used to distribute and connect power to power circuit pad assembly 300 by contacting power vias 306 internally. Note that in the case of the power standoff arrangement describe in FIG. 9, the PTH 308 is typically unplated.

Figure 14B:
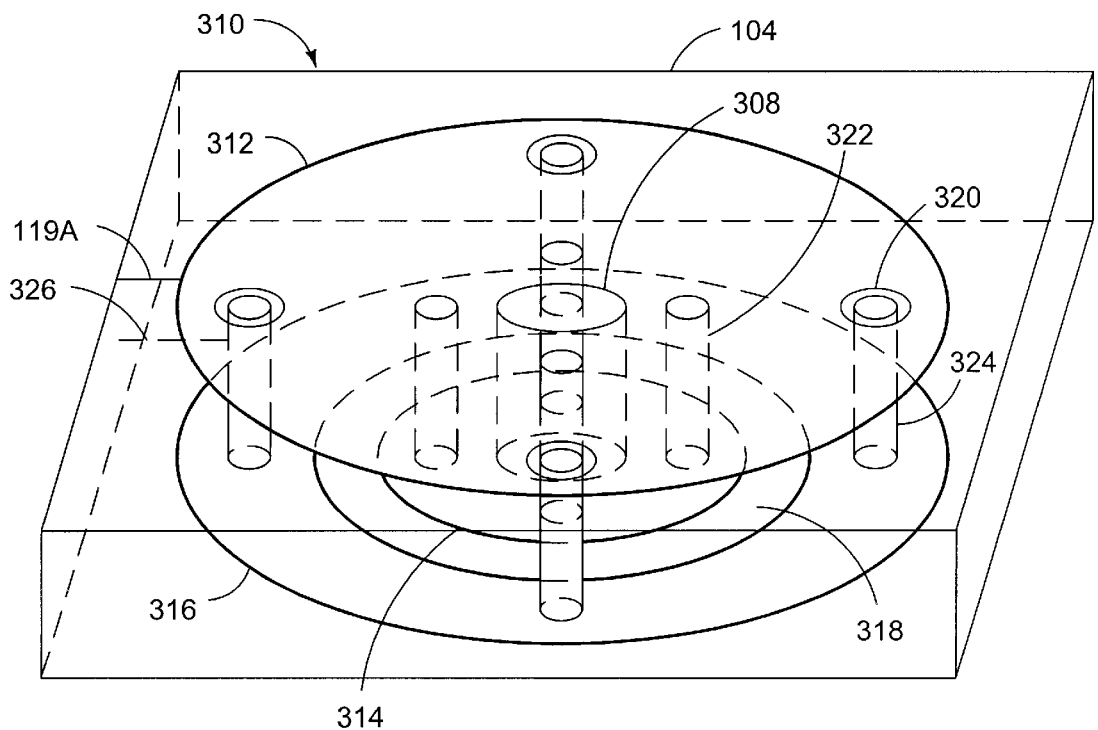

FIG. 14B illustrates power circuit pad assembly 310 which can be used to interface power circuits on PCB 102 and PCB 104 to coaxial power standoff arrangements such as described in FIGS. 10–13. Inner contact pad 314 interfaces to the inner power standoff or fastener and is joined electrically to pad 312 which is the feed for the inner power circuit trough multiple occurrences of power vias 322. Inner PTH 308 receives the fastener or central portion of the standoff as it passes through PCB 102 or PCB 104 and acts as an additional power path between pads 312 and 314. Outer contact pad 316 is electrically isolated from inner contact pad 314 by non conductive area 318, interfaces to the outer power standoff and is joined electrically to multiple occurrences of outer power vias 324. Inner circuit layers of PCB 102 or PCB 104 (not shown) may be used to distribute and connect power to power circuit pad assembly 310 by contacting power vias 320 or 322 internally. Although four occurrences of power vias 322 and 324 ate shown, any number of vias 322 and 324 may be used.

Figure 15:
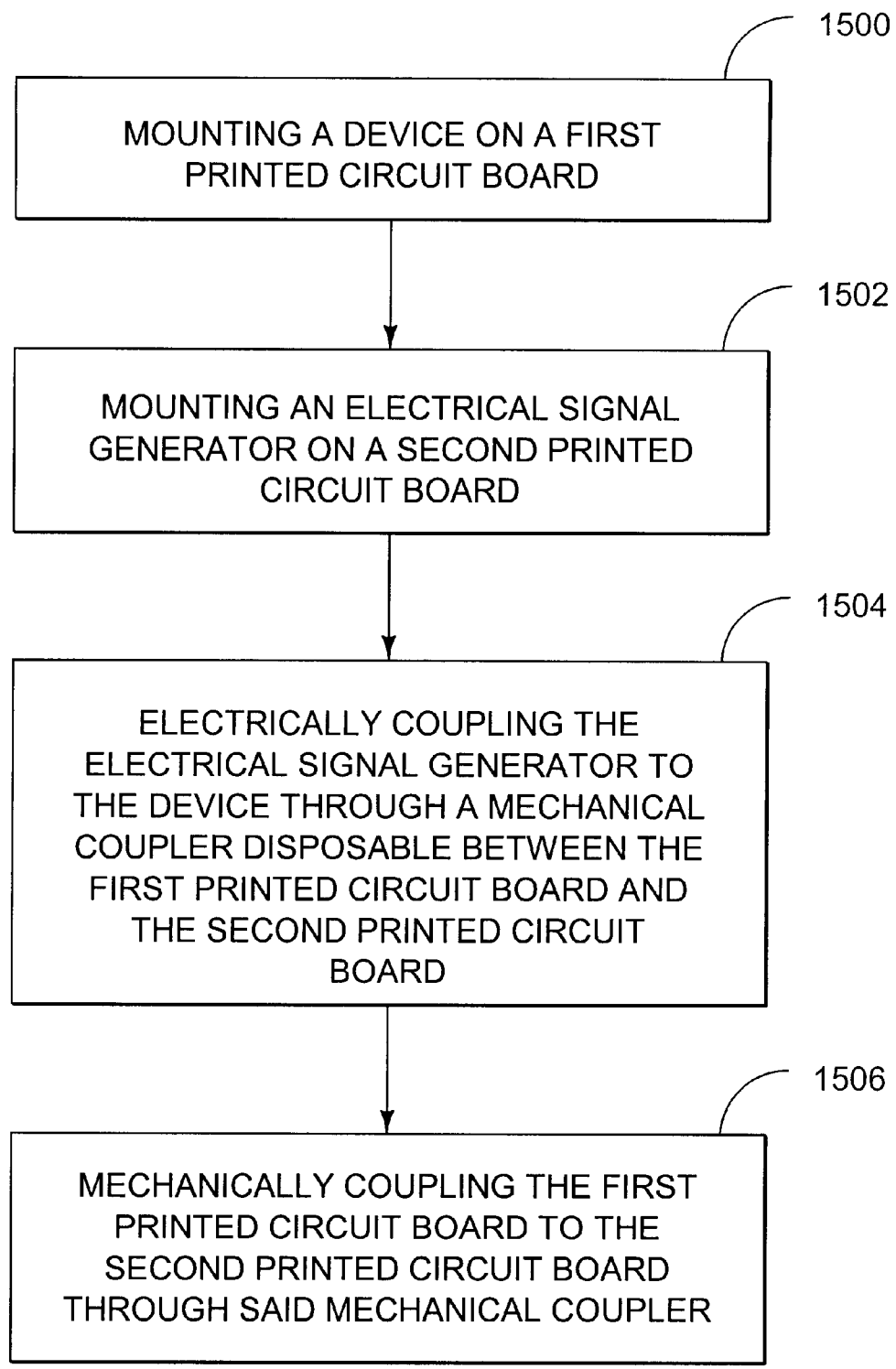
FIG. 15 is a flowchart illustrating the steps used in practicing the present invention.

FIG. 15 is a flowchart illustrating the steps used in practicing the present invention.

Block 1500 represents performing the step of mounting a device on a first printed circuit board.

Block 1502 represents performing the step of mounting an electrical signal generator on a second printed circuit board.

Block 1504 represents performing the step of electrically coupling the electrical signal generator to the device through a mechanical coupler disposed between the first printed circuit board and the second printed circuit board.

Block 1506 represents performing the step of mechanically coupling the first printed circuit board to the second printed circuit board through said mechanical coupler.

Conclusion

This concludes the description of the preferred embodiment of the invention. The following describes some alternative embodiments for accomplishing the present invention. Assembly 100 can have both rigid and flexible layers to accommodate the needs of PCB designers without departing from the scope of the present invention. Further, the thicknesses of assembly 100 can be modified to accommodate components as needed.

Although described with respect to power and thermal considerations, the present invention can also be used to shield device 108 from outside radiative effects, e.g., radiation, electromagnetic interference, etc. Further, device 108 can be shielded from emitting radiation and/or electromagnetic signals to the outside world through the use of the present invention.

In summary, the present invention discloses an encapsulated circuit assembly and methods for making such an assembly. The assembly comprises a first printed circuit board, a second printed circuit board, and a mechanical coupler. The mechanical coupler is coupled between the first printed circuit board and the second printed circuit board and disposed between the first printed circuit board and the second printed circuit board. The mechanical coupler provides substantial electrical continuity between a trace on the first printed circuit board and a trace on the second printed circuit board.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A printed circuit board assembly, comprising:
    a first printed circuit board;
    a second printed circuit board; and
    a mechanical coupler, comprising an inner conductive standoff an outer conductive standoff arranged coaxially with the inner conductive standoff and comprising a unitary standoff extending from the first printed circuit board to the second printed circuit board, the mechanical coupler providing a power path and a ground path from the first circuit board to the second circuit board.

2. The printed circuit board assembly of claim 1, wherein the first circuit board includes a power converter.

3. The printed circuit board assembly of claim 2, wherein:
    the first printed circuit board includes a first circuit board first standoff pad coupled to a power output of the power converter via a first printed circuit board first trace;
    the first printed circuit board includes a first printed circuit board second standoff pad coupled to a ground via a first printed circuit board second trace;
    the second printed circuit board includes a second printed circuit board first standoff pad coupled to a device mounted on the second printed circuit board via a second printed circuit board first trace;
    the second printed circuit board includes a second printed circuit board second standoff pad coupled to the ground via a second printed circuit board second trace; and
    the mechanical coupler couples the first printed circuit board first standoff pad to the second printed circuit board first standoff pad and the first printed circuit board second standoff pad to the second printed circuit board second standoff pad.

4. The printed circuit board assembly of claim 3, wherein:
    the inner conductive standoff couples the first printed circuit board first standoff pad to the second printed circuit board first standoff pad and the outer conductive standoff couples the fist printed circuit board second standoff pad to the second printed circuit board second standoff pad.

5. The printed circuit board assembly of claim 4, wherein the outer conductive standoff is greater in cross section than the first circuit board second trace.

6. The printed circuit board assembly of clam 4, wherein the outer conductive standoff is greater in cross section than the second circuit board second trace.

7. The printed circuit board assembly of claim 4, wherein the mechanical coupler is disposed proximate the device.

8. The printed circuit board assembly of claim 3, wherein the first standoff pad is disposed within the second standoff pad.

9. The printed circuit board assembly of claim 8, wherein the first standoff pad is and the second standoff pad are concentric.

10. The printed circuit board assembly of claim 3, wherein the first circuit board further comprises a plurality of signal traces and the first circuit board trace is of lower impedance than the each of the plurality of signal traces.

11. The printed circuit board assembly of claim 3, wherein the second circuit board further comprises a plurality of signal traces and the second circuit board trace is of lower impedance than each of the plurality of signal traces.

12. The printed circuit board assembly of claim 1, wherein the power converter is thermally coupled to a heatsink.

13. A mechanical coupler for physically coupling a first circuit board and a second circuit board, the mechanical coupler composing;
    an outer conductive standoff;
    an inner conductive standoff disposed within the outer conductive standoff, wherein the mechanical coupler provides a power path and a ground path from a first circuit board to a second circuit board and
    wherein the outer conductive standoff is arranged coaxially with the inner conductive standoff and comprises a unitary standoff extendable from the first printed circuit board to the second printed circuit board.

14. The mechanical coupler of claim 13, wherein the first circuit board includes a power converter.

15. The mechanical coupler of claim 13, wherein:
    the first circuit board includes a first circuit board first standoff pad coupled to a power output of the power converter via a first circuit board first trace;
    the first circuit board includes a first circuit board second standoff pad coupled to a ground via a first circuit board second trace;
    the second circuit board includes a second circuit board first standoff pad coupled to a device mounted on the second circuit board via a second circuit board first trace;
    the second circuit board includes a second circuit board second standoff pad coupled to the ground via a second circuit board second trace; and
    the mechanical coupler couples the first circuit board first standoff pad to the second circuit board first standoff pad and the first circuit board second standoff pad to the second circuit board second standoff pad.

16. The mechanical couplet of claim 15, wherein:
    the inner conductive standoff couples the first circuit board first standoff pad to the second circuit board first standoff pad and the outer conductive standoff couples the first circuit board second standoff pad to the second circuit board second standoff pad.

17. The mechanical coupler of claim 16, wherein the outer conductive standoff is greater in cross section than the first circuit board second trace.

18. The mechanical coupler of claim 16, wherein the outer conductive standoff is greater in cross section than the second circuit board second trace.

19. The mechanical coupler of claim 16, wherein the mechanical coupler is disposed proximate the device.

20. The mechanical coupler of claim 15, wherein the first standoff pad is disposed within the second standoff pad.

21. The mechanical coupler of claim 15, wherein the first standoff pad and the second standoff pad are concentric.

22. The mechanical coupler of claim 15, wherein the first circuit board further comprises a plurality of signal traces and the first circuit board trace is of lower impedance than each of the plurality of signal traces.

23. The mechanical coupler of claim 13, wherein the first circuit board further comprises a plurality of signal traces and the second circuit board trace is of lower impedance than each of the plurality of signal traces.

24. The mechanical coupler of claim 13, wherein the power converter is thermally coupled to a heatsink.

* * * * *